United States Patent
Kondo et al.

(10) Patent No.: US 11,640,137 B2
(45) Date of Patent: May 2, 2023

(54) LIGHT SOURCE DEVICE AND HOLOGRAPHIC OBSERVATION APPARATUS

(71) Applicant: SHIMADZU CORPORATION, Kyoto (JP)

(72) Inventors: Yasushi Kondo, Kyoto (JP); Yoshiyuki Ichinozuka, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 80 days.

(21) Appl. No.: 16/784,526

(22) Filed: Feb. 7, 2020

(65) Prior Publication Data
US 2020/0278641 A1 Sep. 3, 2020

(30) Foreign Application Priority Data
Feb. 7, 2019 (JP) .............................. JP2019-020964

(51) Int. Cl.
*H01S 5/00* (2006.01)
*G03H 1/04* (2006.01)
(Continued)

(52) U.S. Cl.
CPC ......... *G03H 1/0465* (2013.01); *G03H 1/0005* (2013.01); *G03H 1/0443* (2013.01);
(Continued)

(58) Field of Classification Search
CPC ......... G03H 2001/005; G03H 2223/24; G03H 2222/34; G03H 2223/16;
(Continued)

(56) References Cited

U.S. PATENT DOCUMENTS 5,500,911 A * 3/1996 Roff ..................... G02B 6/4207
385/33
2007/0098028 A1* 5/2007 Alcock ..................... H01S 5/06
372/29.015

(Continued)

FOREIGN PATENT DOCUMENTS

CN 109164544 A 1/2019
CN 109219778 A 1/2019
(Continued)

OTHER PUBLICATIONS

Office Action dated Aug. 4, 2021 from the China National Intellectual Property Administration in CN Application No. 202010082550.8.

(Continued)

*Primary Examiner* — Audrey Y Chang
(74) *Attorney, Agent, or Firm* — Sughrue Mion, PLLC

(57) ABSTRACT

A light source device connected to an optical fiber and emit light from the optical fiber, the device includes: a plurality of laser light sources to respectively emit light at different wavelengths; a current source to supply a drive current with a superimposed alternating-current component to each laser light source; a light source control section to selectively switch the laser light sources by controlling the current sources; a plurality of optical systems disposed in optical paths of the respective laser light sources to reflect the light from the respective laser light sources to an incident end of the optical fiber and to reflect return light reflected on the incident end to the respective laser light sources; and a return light adjustment section to adjust an amount of the return light to continuously spread a spectrum of the light emitted from the optical fiber.

10 Claims, 6 Drawing Sheets

(51) Int. Cl.
  *G03H 1/00* (2006.01)
  *H01S 5/026* (2006.01)
  *H01S 5/06* (2006.01)
(52) U.S. Cl.
  CPC .............. *H01S 5/0261* (2013.01); *H01S 5/06* (2013.01); *G03H 2001/005* (2013.01); *G03H 2001/0447* (2013.01); *G03H 2222/12* (2013.01); *G03H 2222/34* (2013.01); *G03H 2223/16* (2013.01); *G03H 2223/24* (2013.01)
(58) Field of Classification Search
  CPC ........... G03H 2001/0212; G02B 27/10; G01B 11/164; H01S 5/06; H01S 5/4075
  USPC ................................. 356/450, 457, 460, 477
  See application file for complete search history.

(56) References Cited

U.S. PATENT DOCUMENTS

| | | | | |
|---|---|---|---|---|
| 2010/0097534 | A1* | 4/2010 | Teller | H04N 9/3129 348/756 |
| 2010/0328578 | A1* | 12/2010 | Biernath | G02F 1/13362 349/64 |
| 2016/0246043 | A1* | 8/2016 | Morita | G02B 27/56 |
| 2017/0017202 | A1* | 1/2017 | Lu | G03H 1/0443 |
| 2019/0252850 | A1* | 8/2019 | Elgcrona | H01S 5/4075 |
| 2019/0294107 | A1 | 9/2019 | Kondo et al. | |

FOREIGN PATENT DOCUMENTS

| | | |
|---|---|---|
| EP | 3 267 536 A1 | 1/2018 |
| WO | WO2017/204013 A | 11/2018 |

OTHER PUBLICATIONS

Office Action dated Apr. 6, 2022 from the China National Intellectual Property Administration in CN Application No. 202010082550.8.

Office Action dated Jun. 7, 2022 in Japanese Application No. 2019-020964.

Office Action dated Nov. 29, 2022 issued by the Japanese Patent Office in Japanese Application Machine No. 2019-020964.

* cited by examiner

FIG. 4A  NO ALTERNATING CURRENT COMPONENT SUPERIMPOSED
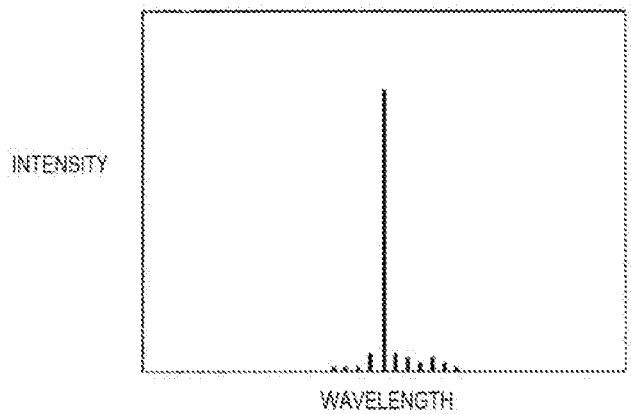
FIG. 4B  RETURN LIGHT FORMED
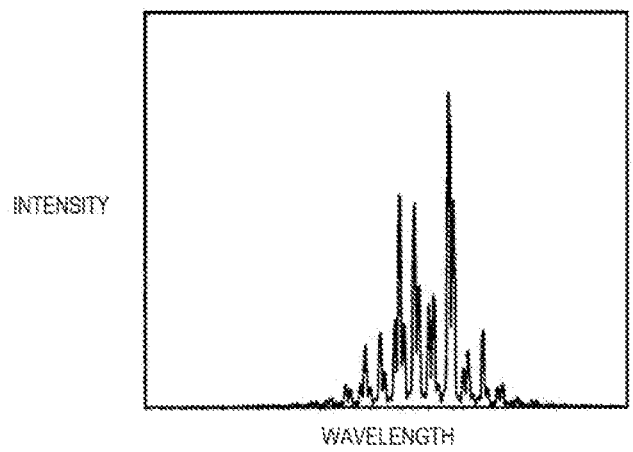
FIG. 4C  LOW-FREQUENCY COMPONENT SUPERIMPOSED
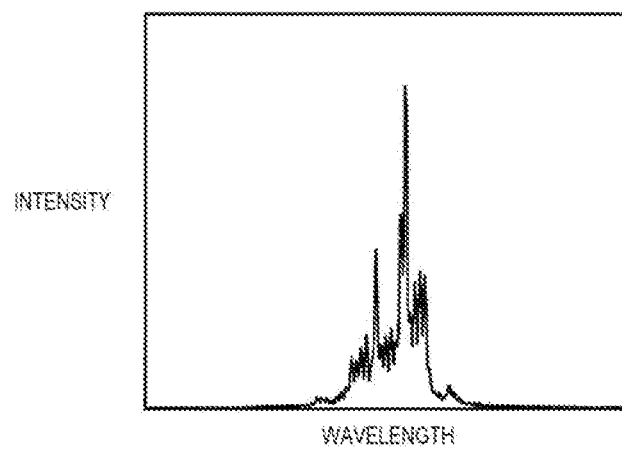

LIGHT SOURCE DEVICE AND HOLOGRAPHIC OBSERVATION APPARATUS

BACKGROUND OF THE INVENTION

1. Field of the Invention

The present invention relates to a light source device used for an apparatus to observe a target object and the like using holography and a holographic observation apparatus provided with the light source device.

2. Description of the Related Art

Holographic observation apparatuses are conventionally provided for practical use as an apparatus to observe iPS cells and other cells. In such a holographic observation apparatus, a light beam in phase (coherent light beam) is split into two light beams: one of them is applied to a target object to pass through or be reflected on; and the other directly travels, and both light beams interfere with each other on an image plane to obtain a holographic image (hologram). The hologram thus obtained contains information on a three dimensional shape, optical composition, and the like of the target object and is subjected to various calculations to extract these kinds of information.

For observation of living cells using such a holographic observation apparatus, the cells are observed on a glass plate or in suspension in a culture medium in a container. In this case, the container, the glass plate, and the like, in addition to the cells as the observation target object, are on the optical path, causing a phase shift of the coherent light beam not only by the observation target object but also by the container, the glass plate, and the like. If a phase shift occurs due to the container, the glass plate, and the like, the interference by the phase shift due to the container, the glass plate, and the like affects an interference figure produced by the phase shift due to the observation target object (cells) (i.e., degrades the image quality of the hologram of the observation target object (cells)).

Accordingly, use of a light beam with a short coherence length is proposed to eliminate the influence of the phase shift due to the objects other than the observation target object (non-target objects for observation) as much as possible and to detect only an interference figure produced by the phase shift due to the observation target object (WO 2017/204013).

WO 2017/204013 describes a configuration to obtain a light beam with a short coherence length and a broad spectrum (i.e., low coherent light beam) where, in a holographic observation apparatus provided with a semiconductor laser light source, light emitted from the semiconductor laser light source is partially reflected on an end surface of a ferrule where the light is incident to be returned to the semiconductor laser light source (i.e., to form return light) and the semiconductor laser light source is driven by a current with a superimposed alternating-current component. WO 2017/204013 also describes a configuration to obtain an image of an observation target object with high resolution where four kinds of holographic images are obtained using four kinds of semiconductor laser light sources at different wavelengths for reconstruction of an image of the observation target object.

The holographic observation apparatus in WO 2017/204013 allows production of a light beam with a broad spectrum (i.e., low coherent light beam) using a general-purpose semiconductor laser light source, production of a less degraded holographic image, and production of an image of the observation target object with high resolution. However, the position of light emission at each wavelength has to physically coincide with each other for use of the four kinds of semiconductor laser light sources at different wavelengths. In the configuration of WO 2017/204013, since the light from the semiconductor laser light sources is concentrated to a ferrule and led by optical fibers, the light at each wavelength led by each optical fiber has to be multiplexed by an optical fiber coupler and the like to form a light source with a single optical axis. In such a configuration of multiplexing by an optical fiber coupler and the like, the attenuation factor of the light is so large that a high intensity semiconductor laser light source has to be provided and an individual optical system for each wavelength has to be configured for adjustment, causing problems of a complex apparatus configuration and difficulty in miniaturization. Such an optical fiber coupler also has a problem of high costs because skills are expected for production causing the lengthy production lead times.

SUMMARY

The present invention has been made in view of such circumstances, and it is an object thereof to provide a small light source device that allows easy multiplex without using an optical fiber coupler as in the past and uses light with high efficiency and to provide a holographic observation apparatus provided with such a light source device.

To achieve the above problems, a light source device of the present invention connected to an optical fiber and emit light from the optical fiber, the device includes: a plurality of laser light sources to respectively emit light at different wavelengths; a current source to supply a drive current with a superimposed alternating-current component to each laser light source; a light source control section to selectively switch the laser light sources by controlling the current sources; a plurality of optical systems disposed in optical paths of the respective laser light sources to reflect the light from the respective laser light sources to an incident end of the optical fiber and to reflect return light reflected on the incident end to the respective laser light sources; and a return light adjustment section to adjust an amount of the return light to continuously spread a spectrum of the light emitted from the optical fiber.

According to such a configuration, light from the plurality of laser light sources are multiplexed by the plurality of optical systems without having to use an optical fiber coupler as in the past, thereby achieving a small and inexpensive light source device that uses light with high efficiency. In addition, the return light adjustment section is provided to readily adjust light emitted from the optical fiber to be a light beam with a short coherence length and a broad spectrum (i.e., low coherent light beam).

Each optical system may be disposed along an optical axis of the optical fiber to cause an optical path center of the light directed from each optical system to the incident end of the optical fiber to approximately coincide with the optical axis of the optical fiber.

The return light adjustment section may be configured to adjust the amount of the return light by changing an angle of the return light relative to an optical axis of each laser light source.

The return light adjustment section may be configured to adjust the amount of the return light by changing an angle of an optical axis of each laser light source relative to the respective optical system.

The return light adjustment section may be configured to have a plurality of dichroic mirrors corresponding to the wavelength of each laser light source and having a transmittance set based on the amount of the return light, and based on the laser light source selected by the light source control section, the dichroic mirror corresponding to the laser light source may be configured to be disposed between the optical systems and the incident end of the optical fiber.

The light source device may be configured to further include a plurality of condenser lenses disposed between the respective laser light sources and the respective optical systems to concentrate the light from the respective laser light sources, wherein the return light adjustment section adjusts the amount of the return light by changing an angle of each condenser lens relative to an optical axis of the respective laser light source.

Each optical system may be configured with a reflection bandpass filter having a flat reflection surface to reflect the light from the laser light source corresponding to the optical system and to transmit the light from the other laser light sources.

Each optical system may be configured with a reflection bandpass filter having an elliptic or parabolic reflection surface to reflect the light from the laser light source corresponding to the optical system and to transmit the light from the other laser light sources.

A frequency of the alternating current component may be configured to be from 50 kHz to 300 kHz.

The incident end of the optical fiber may be configured to be a tapered surface inclined from 3° to 7° relative to an optical axis of the optical fiber.

Each optical system may be configured to have a first optical element and a second optical element disposed in the optical path of the respective laser light source, the first optical element to reflect the light from the respective laser light source to the incident end of the optical fiber and the second optical element to reflect the return light reflected on the incident end of the optical fiber to the respective laser light source.

From another perspective, a holographic observation apparatus of the present invention includes: any one of the above light source device; an illumination optical system to cause the light emitted from the optical fiber to transmit or to be reflected on an observation target object for interference of the transmitted or reflected light in a different position of the observation target object; and an image sensor to acquire an interference figure produced by the light that has transmitted or is reflected on the observation target object.

As described above, according to the present invention, a small light source device is achieved that allows easy multiplex without using an optical fiber coupler as in the past and uses light with high efficiency. In addition, a holographic observation apparatus is also achieved that is provided with such a light source device.

BRIEF DESCRIPTION OF THE DRAWINGS

FIGS. 4A to 4C are graphs illustrating emission spectrums of light emitted from a semiconductor laser diode of the holographic observation apparatus according to the above embodiment of the present invention.

DETAILED DESCRIPTION OF THE PREFERRED EMBODIMENTS

Figure 1:
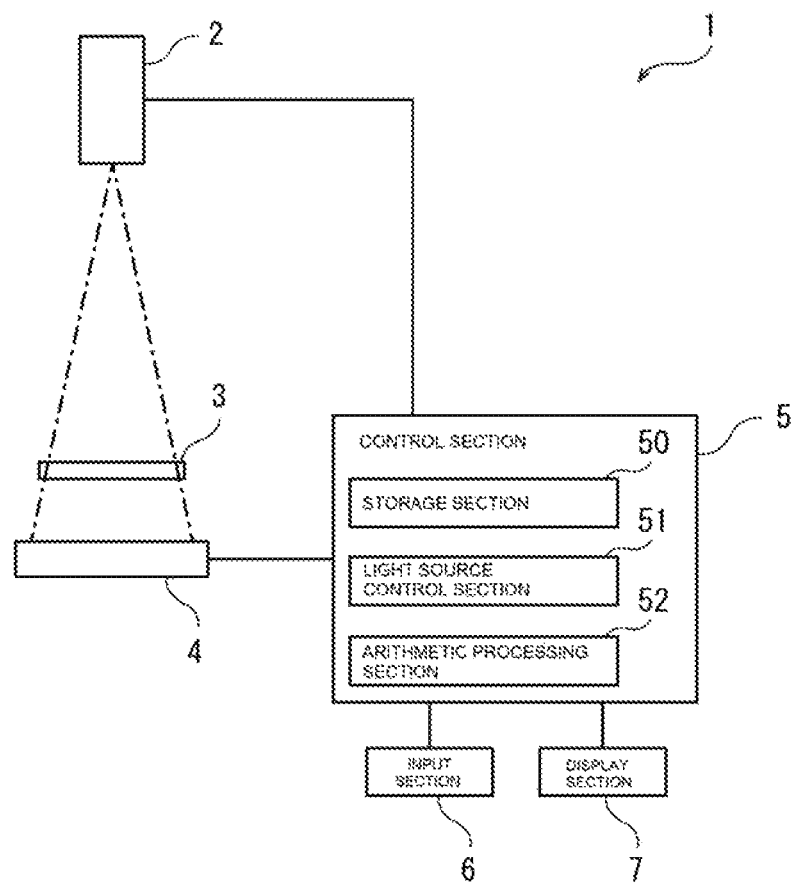
FIG. 1 is a diagram illustrating a schematic configuration of a holographic observation apparatus according to an embodiment of the present invention.

Embodiments of the present invention are described below in detail with reference to the drawings. An identical sign is given to identical or equivalent parts in the drawings not to repeat the description.

Configuration of Holographic Observation Apparatus

FIG. 1 is a diagram illustrating a schematic configuration of a holographic observation apparatus according to an embodiment of the present invention. As illustrated in FIG. 1, a holographic observation apparatus 1 in the present embodiment is a so-called in-line holographic observation apparatus that is used to acquire an observation image of cells, such as iPS cells and ES cells, cultured on a culture plate. The holographic observation apparatus 1 includes a light source section 2, an image sensor 4, and a control section 5 and is configured that cells on a culture plate 3 are irradiated with light with a small spread angle (approx. 10 degrees) emitted from the light source section 2. While interfering with light transmitted through a position adjacent to the cells on the culture plate 3, the light transmitted through the cells and the culture plate 3 reaches the image sensor 4 to acquire hologram data by the image sensor 4. An irradiation optical system may be disposed between the light source section 2 and the culture plate 3 to cause a spot size of light emitted from the light source unit 2 to be large enough for the whole cells to be irradiated. The light emitted from the light source section 2 in the present embodiment is light with lower coherence than high coherent light, such as semiconductor laser light, and may also be referred to herein as pseudo-coherent light or a pseudo-coherent light beam.

The control section 5 is provided with a storage section 50, a light source control section 51 to control operation of the light source section 2, and an arithmetic processing section 52. The arithmetic processing section 52 obtains phase information by numerical calculation from the hologram data (two dimensional intensity distribution data of a pseudo-coherent light beam formed on a detection surface of the image sensor 4) acquired by the image sensor 4 to prepare an observation image of the cells. In the storage section 50, pseudo-coherent light beam characteristic information (described later in detail) is stored in advance that is information on relationship between the magnitude of a current supplied to semiconductor laser diodes 241 to 244 (FIG. 2) of the light source section 2 and the intensity of the pseudo-coherent light beam and relationship between the coherence length of the pseudo-coherent light beam and the amplitude and the frequency of an alternating current signal. The control section 5 is connected to an input section 6 and a display section 7, and an observation image prepared by the arithmetic processing section 52 is displayed on the display section 7.

Figure 2:
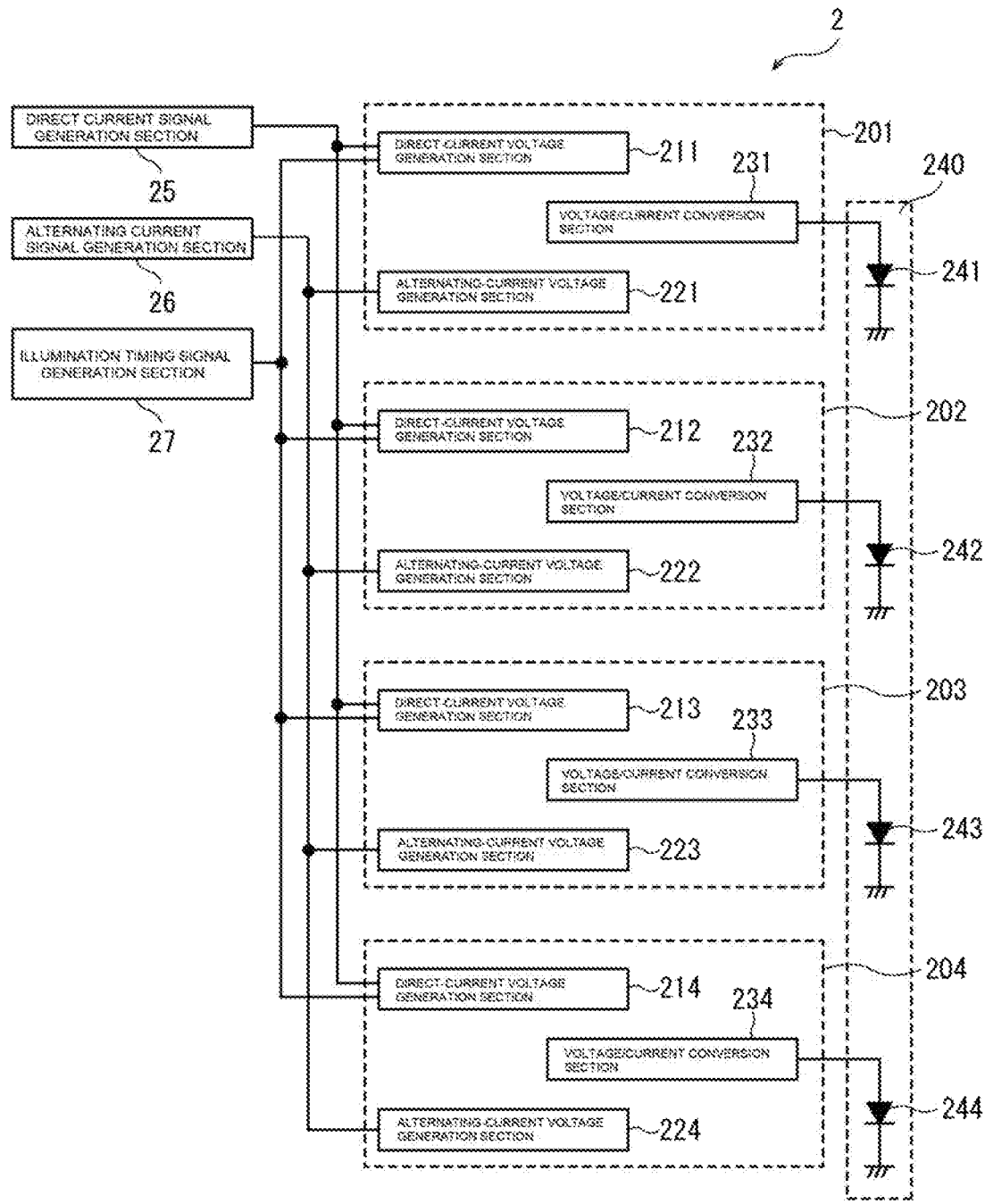
FIG. 2 is a block diagram of a light source section of the holographic observation apparatus according to the above embodiment of the present invention.

FIG. 2 is a block diagram of the light source section 2 in the present embodiment. As illustrated in FIG. 2, the light source section 2 is provided with: a light source module 240 having the semiconductor laser diodes 241 to 244 (laser light sources) to emit light at wavelengths different from each other; and drive current supply sections 201 to 204 (current sources) to supply drive currents to the respective semiconductor laser diodes 241 to 244. The drive current supply sections 201 to 204 are respectively provided with direct-current voltage generation sections 211 to 214 to generate a direct-current voltage, alternating-current voltage generation sections 221 to 224 to generate an alternating-current voltage to be superimposed on the direct-current voltage, and voltage/current conversion sections 231 to 234. The light source section 2 is further provided with a direct current signal generation section 25 to generate direct current signals to be sent to the direct-current voltage generation sections 211 to 214, an alternating current signal generation section 26 to generate alternating current signals to be supplied to the alternating-current voltage generation sections 221 to 224, and an illumination timing signal generation section 27 (light source control section) to generate timing signals to be supplied to the direct-current voltage generation sections 211 to 214.

In the present embodiment, based on an instruction input by a user on the intensity and the coherence length of the pseudo-coherent light beam and the pseudo-coherent light beam characteristic information stored in the storage section 50, the light source control section 51 determines the magnitude of the direct-current voltage generated by each of the direct-current voltage generation sections 211 to 214 and these kinds of information are input to the direct current signal generation section 25. Then, by the magnitude of the direct current signals to be sent from the direct current signal generation section 25 to the respective direct-current voltage generation sections 211 to 214, the (average) intensity of the pseudo-coherent light beam emitted from the respective semiconductor laser diodes 241 to 244 is controlled. The light source control section 51 determines values of the amplitude and the frequency of the alternating-current voltage generated by the alternating-current voltage generation sections 221 to 224 and inputs these kinds of information to the alternating current signal generation section 26. Then, by the frequency and the amplitude of the alternating current signals to be sent from the alternating current signal generation section 26 to the respective alternating-current voltage generation sections 221 to 224, the coherence length of the pseudo-coherent light beam emitted from the respective semiconductor laser diodes 241 to 244 is controlled. Although described later in detail, the frequency of the alternating current signals is set at a frequency sufficiently higher than a readout frequency of the image sensor 4 (e.g., frequency approx. 1000 times), and the coherence length is set at an appropriate length (e.g., hundreds of μm) in accordance with the size and the optical properties of the observation target object. To reduce the coherence of the light emitted from the respective semiconductor laser diodes 241 to 244, the respective semiconductor laser diodes 241 to 244 are configured to return the return light.

The illumination timing signal generation section 27 sends timing signals via the direct-current voltage generation sections 211 to 214 to the respective semiconductor laser diodes 241 to 244 in order. When the timing signals are sent to the direct-current voltage generation sections 211 to 214, the respective drive current supply sections 201 to 204 superimpose the alternating current signals generated by the alternating-current voltage generation sections 221 to 224 on the direct current signals generated by the direct-current voltage generation sections 211 to 214 and send them to the voltage/current conversion sections 231 to 234 to supply drive currents to the semiconductor laser diodes 241 to 244. The observation target object is thus irradiated with pseudo-coherent light beams at different wavelengths in order to acquire holographic images of the observation target object by the pseudo-coherent light beams at the respective wavelengths.

Since the mode of the interference of each pseudo-coherent light beam applied to the observation target object differs depending on the wavelength of the light beam, the observation target object is irradiated with the four kinds of pseudo-coherent light beams at different wavelengths as described above to acquire four kinds of different holographic images in accordance with the wavelengths and thus four kinds of hologram data are acquired by the image sensor 4. The arithmetic processing section 52 of the control section 5 then obtains the phase information by numerical calculation from the four kinds of hologram data acquired by the image sensor 4 to reconfigure an image of the observation target object, thereby generating an image of the observation target object with high resolution. The observation image generated by the arithmetic processing section 52 is displayed on the display section 7.

As described above, with the holographic observation apparatus 1 of the present embodiment, cells on the culture plate 3 are observed. When a user inputs the values of the estimated thickness of the cells (in general, approx. from tens to hundred of μm) and the thickness of the culture plate 3 (in general, approx. 1 mm) via the input section 6, the light source control section 51 determines the amplitude and the frequency of the alternating current signals based on the pseudo-coherent light beam characteristic information in such a manner that the pseudo-coherent light beams to be generated have a coherence length longer than the thickness (e.g., from tens to hundred of μm) of the observation target object (cells) and shorter than the thickness (e.g., approx. 1 mm) of the non-target object for observation (culture plate 3) on the optical path. The frequency is set at a frequency sufficiently higher than a signal readout period of the image sensor 4 (e.g., frequency 1000 times higher than the signal readout frequency of the image sensor 4). In the present embodiment, the thickness of the culture plate 3 is input because the culture plate 3 is the only non-target object for observation on the optical path, whereas the user also inputs the thicknesses of a container that contains a sample, a glass plate, and the like when they are on the optical path. Alternatively, the use inputs the thickness of the thinnest object among the non-target objects for observation. Although this example is configured to input only the thicknesses of the cells and the culture plate 3, it is preferably configured to input a refractive index in addition to the thickness and have the coherence length of the pseudo-coherent light beams longer than the optical thickness (product of the physical thickness and the refractive index) of the observation target object and shorter than the optical thickness of non-target object(s) for observation because, in the case where the observation target object and the like are thick, the optical path length greatly varies depending on the refractive index.

As just described, in the holographic observation apparatus 1 of the present embodiment, the amplitude and the frequency of the alternating current signals are determined in such a manner that the coherence length of the pseudo-coherent light beams is longer than the thickness (e.g., from tens to hundred of μm) of the observation target object (cells) and shorter than the thickness (e.g., approx. 1 mm) of the non-target object for observation (culture plate 3) on the optical path. To obtain such pseudo-coherent light beams of low coherence, the present embodiment is configured to return the return light to the respective semiconductor laser diodes 241 to 244.

Specific Configuration of Light Source Module 240

Figure 3:
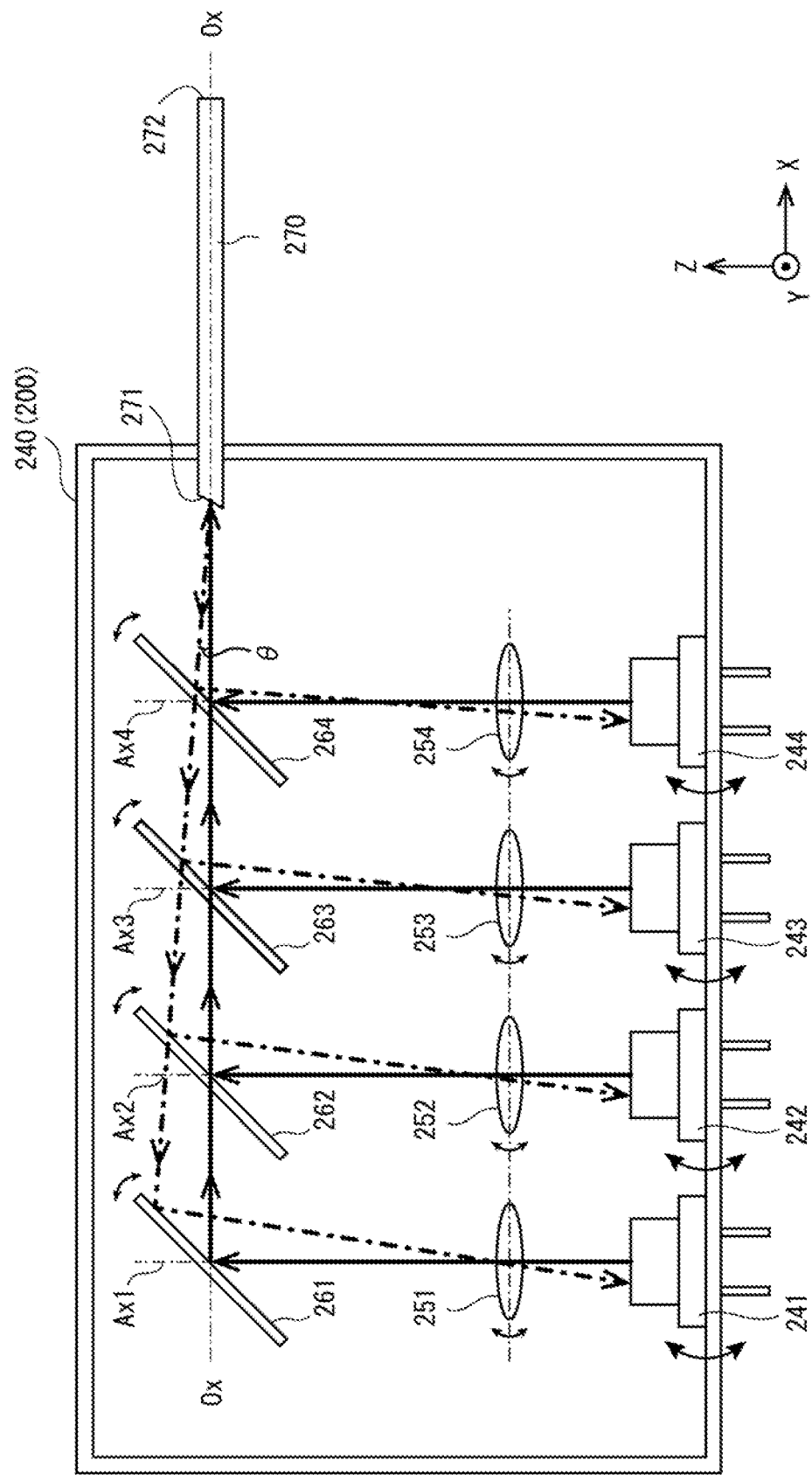
FIG. 3 is a cross-sectional view illustrating a configuration example of a light source module of the holographic observation apparatus according to the above embodiment of the present invention.

FIG. 3 is a cross-sectional view illustrating a configuration example of the light source module 240 of the light source section 2 in the present embodiment. As illustrated in FIG. 3, the light source module 240 in the present embodiment is provided with: the four semiconductor laser diodes 241 to 244 to emit light at wavelengths different from each other; condenser lenses 251 to 254 to concentrate the light emitted from the respective semiconductor laser diodes 241 to 244; reflective mirrors 261 to 264 (optical system) to reflect the light through the respective condenser lenses 251 to 254; an optical fiber 270 to receive the incident light reflected on the respective reflective mirrors 261 to 264 and lead the light to be emitted to the cells on the culture plate 3; and a box case 200 containing the semiconductor laser diodes 241 to 244, the condenser lenses 251 to 254, and the reflective mirrors 261 to 264 and supporting a base end of the optical fiber 270. As illustrated in FIG. 3, in the present embodiment, the following description is given by defining the direction parallel to an optical axis Ox of the optical fiber 270 as an X axis direction, the direction parallel to optical axes Ax1 to Ax4 of the semiconductor laser diodes 241 to 244 as a Z axis direction, and the direction orthogonal to the X axis direction and the Z axis direction as a Y axis direction.

The semiconductor laser diodes 241 to 244 are light emitting devices to emit light at wavelengths different from each other (e.g., 400 nm, 520 nm, 750 nm, and 800 nm) and are disposed at the bottom in the case 200 at predetermined intervals in the X axis direction. The respective semiconductor laser diodes 241 to 244 have electrodes electrically connected to the voltage/current conversion sections 231 to 234 (FIG. 2), and the semiconductor laser diodes 241 to 244 emits light of predetermined intensity (indicated by arrows in solid lines in FIG. 3) in accordance with the drive currents supplied from the voltage/current conversion sections 231 to 234 along the optical axes Ax1 to Ax4.

The condenser lenses 251 to 254 are optical elements to concentrate the light emitted from the respective semiconductor laser diodes 241 to 244 to an incident end surface 271 of the optical fiber 270 and are disposed in the optical path of the semiconductor laser diodes 241 to 244 in such a manner that the optical axes of the respective condenser lenses 251 to 254 approximately coincide with the optical axes Ax1 to Ax4 of the semiconductor laser diodes 241 to 244. In FIG. 3, the respective condenser lenses 251 to 254 are illustrated as biconvex single-element lenses, whereas they may be configured with multiple-element lenses The reflective mirrors 261 to 264 are optical elements to reflect the light through the respective condenser lenses 251 to 254 to the incident end surface 271 of the optical fiber 270 and reflect the light reflected on the incident end surface 271 to the condenser lenses 251 to 254 and the semiconductor laser diodes 241 to 244, and in the present embodiment, they are flat reflective bandpass filter mirrors configured to only reflect the light of the corresponding semiconductor laser diodes 241 to 244. The respective reflective mirrors 261 to 264 in the present embodiment reflect the light incident on a plane of incidence along the optical axis Ox of the optical fiber 270 (i.e., in the X axis direction). The respective reflective mirrors 261 to 264 are rotatably configured about central axes extending in the Y axis direction through intersections of the optical axis Ox of the optical fiber 270 and the optical axes Ax1 to Ax4 of the semiconductor laser diodes 241 to 244 and are capable of adjusting the angles by an angle adjustment mechanism (return light adjustment section), not shown. As described above, the respective reflective mirrors 261 to 264 in the present embodiment are configured to only reflect the light of the corresponding semiconductor laser diodes 241 to 244, and thus the light reflected on the reflective mirror 261 (i.e., light at the wavelength of the semiconductor laser diode 241) passes through the reflective mirrors 262, 263, and 264 to be incident on the incident end surface 271 of the optical fiber 270. Likewise, the light reflected on the reflective mirror 262 (i.e., light at the wavelength of the semiconductor laser diode 242) passes through the reflective mirrors 263 and 264 to be incident on the incident end surface 271 of the optical fiber 270, the light reflected on the reflective mirror 263 (i.e., light at the wavelength of the semiconductor laser diode 243) passes through the reflective mirror 264 to be incident on the incident end surface 271 of the optical fiber 270, and the light reflected on the reflective mirror 264 (i.e., light at the wavelength of the semiconductor laser diode 244) is directly incident on the incident end surface 271 of the optical fiber 270.

As illustrated in FIG. 3, the incident end surface 271 of the optical fiber 270 in the present embodiment is a tapered surface in such a manner that the normal line and the optical axis Ox are inclined to make a predetermined angle θ that is not 0 and is configured to partially reflect the light incident on the incident end surface 271. In other words, a portion of the light incident on the incident end surface 271 is reflected at the predetermined angle θ relative to the optical axis Ox and the light except the reflected light is incident on the incident end surface 271 into the optical fiber 270 to be led for emission from an emitting end surface 272. In the light reflected on the incident end surface 271 (indicated by arrows in dash-dotted lines in FIG. 3), the light at the wavelength of the semiconductor laser diode 244 is reflected on the reflective mirror 264 to pass through the condenser lens 254 and to be incident on the semiconductor laser diode 244 as return light. In the light reflected on the incident end surface 271, the light at the wavelength of the semiconductor laser diode 243 is reflected on the reflective minor 263 to pass through the condenser lens 253 and to be incident on the semiconductor laser diode 243 as return light. In the light reflected on the incident end surface 271, the light at the wavelength of the semiconductor laser diode 242 is reflected on the reflective minor 262 to pass through the condenser lens 252 and to be incident on the semiconductor laser diode 242 as return light. In the light reflected on the incident end surface 271, the light at the wavelength of the semiconductor laser diode 241 is reflected on the reflective minor 261 to pass through the condenser lens 251 and to be incident on the semiconductor laser diode 241 as return light.

As just described, the present embodiment is configured to return a portion of the light emitted from the respective semiconductor laser diodes 241 to 244 to the respective semiconductor laser diodes 241 to 244 (i.e., to form return light). In the configuration to form return light to the general semiconductor laser diodes 241 to 244 that oscillate in single mode, the emission spectrum becomes discretely spread.

FIGS. 4A to 4C are graphs illustrating emission spectrums of the light emitted from the semiconductor laser diodes 241 to 244 in the present embodiment, where FIG. 4A illustrates an emission spectrum with no return light, FIG. 4B illustrates an emission spectrum with return light, and FIG. 4C illustrates an emission spectrum with return light and with a superimposed low-frequency alternating-current component (described later in detail). In FIGS. 4A through 4C, the horizontal axis indicates wavelengths (nm) and the vertical axis indicates intensity (mW).

As illustrated in FIG. 4B, in the configuration where the light emitted from the respective semiconductor laser diodes 241 to 244 partially returns to the respective semiconductor laser diodes 241 to 244 (forms return light), the spectrum becomes discretely spread. The spectral width in this situation varies with the amount of the return light and the characteristics of the respective semiconductor laser diodes 241 to 244. In the present embodiment, the respective reflective mirrors 261 to 264 are rotatably configured about central axes extending in the Y axis direction, and the angles to rotate the respective reflective mirrors 261 to 264 are adjusted by the angle adjustment mechanism to change the angles of the return light relative to the optical axes Ax1 to Ax4 of the respective semiconductor laser diodes 241 to 244, thereby adjusting the amount of the return light to the respective semiconductor laser diodes 241 to 244. That is, by adjusting the angles to rotate the respective reflective mirrors 261 to 264, the emission spectra of the respective semiconductor laser diodes 241 to 244 are adjusted to be in the shape as illustrated in FIG. 4B. Although an angle θ of the incident end surface 271 of the optical fiber 270 also influences the amount of the return light, the angle θ is defined in a range between 3° to 7° in the present embodiment, thereby reflecting from 10% to 90% of the light emitted from the respective semiconductor laser diodes 241 to 244 to the respective semiconductor laser diodes 241 to 244. Although the present embodiment is configured to adjust the angles to rotate the respective reflective mirrors 261 to 264, another embodiment may be configured to adjust the angles to rotate the condenser lenses 251 to 254 for adjustment of the amount of the return light to the respective semiconductor laser diodes 241 to 244 by adjusting the angles to rotate the condenser lenses 251 to 254. In still another configuration, the angles to rotate the semiconductor laser diodes 241 to 244 may be adjusted for adjustment of the amount of the return light to the respective semiconductor laser diodes 241 to 244 by adjusting the angles to rotate the semiconductor laser diodes 241 to 244 (i.e., by changing the angles of the optical axes Ax1 to Ax4 of the respective semiconductor laser diodes 241 to 244 relative to the respective reflective mirrors 261 to 264).

Control of Coherence Length

As described above, in the present embodiment, the coherence lengths of the pseudo-coherent light beams emitted from the respective semiconductor laser diodes 241 to 244 are controlled by the frequency and the amplitude of the alternating current signals sent from the alternating current signal generation section 26 to the respective alternating-current voltage generation sections 221 to 224. Specifically, since it is known that a greater amplitude of the alternating current signals superimposed on the drive currents of the semiconductor laser diodes 241 to 244 causes greater spread of the spectral widths of the light beams, a decrease in coherence, and a shorter coherence length and that superimposition of an alternating current signal at a low frequency approximately from 50 kHz to 300 kHz causes a broadened oscillation spectrum, a continuously spread spectral width of the light beam, a decrease in coherence, and a shorter coherence length (refer to WO 2017/204013), such characteristics are used to control the coherence lengths of the pseudo-coherent light beams. For example, superimposition of an alternating current signal at a frequency of 100 kHz causes the spectral width to be continuously spread and the emission spectrum illustrated in FIG. 4C is obtained. As described above, the frequency of the alternating current signal to be superimposed on the drive current is preferably a frequency capable of modulating the semiconductor laser light in a period sufficiently shorter than the signal readout period of the image sensor 4 (i.e., frequency sufficiently higher than the signal readout frequency of the image sensor 4) and particularly preferably a frequency approximately 1000 times higher than the signal readout frequency of the image sensor 4. For example, in the case of a general image sensor, the signal readout period is 33 mm (readout frequency of 30 Hz) and thus the low-frequency alternating current signal from 50 kHz to 300 kHz described above is preferred.

As just described, in the holographic observation apparatus 1 of the present embodiment, return light is formed to the semiconductor laser diodes 241 to 244 and an alternating-current voltage at the predetermined amplitude and frequency are generated considering the thicknesses (and the refractive index) of the observation target object and the non-target object for observation on the optical path to be superimposed on the direct-current voltage for driving the semiconductor laser diodes 241 to 244, thereby obtaining a laser light beam with a desired coherence length (pseudo-coherent light beam). Then, as described above, irradiation of the observation target object with the four kinds of pseudo-coherent light beams at different wavelengths allows acquisition of four kinds of hologram data in accordance with the wavelengths, and an image of the observation target object is reconfigured based on them to generate an image of the observation target object with high resolution. In the light source module 240 of the present embodiment, the light of the semiconductor laser diodes 241 to 244 are multiplexed by the reflective mirrors 261 to 264 without using an optical fiber coupler as in the past to allow significant miniaturization of the light source module 240 in comparison with that in the past.

Although the present embodiment has been described above, the present invention is not limited to the above configuration and is allowed to be variously modified within the scope of the technical idea of the present invention.

For example, although the reflective mirrors 261 to 264 are described as the optical elements to reflect the light through the respective condenser lenses 251 to 254 to the incident end surface 271 of the optical fiber 270 and to reflect the light reflected on the incident end surface 271 to the condenser lenses 251 to 254 and the semiconductor laser diodes 241 to 244 in the present embodiment, the present invention is not limited to such a configuration. The return light may be formed to the respective semiconductor laser diodes 241 to 244, and for example, the respective reflective mirrors 261 to 264 may be configured with two elements of mirrors (first optical elements) to reflect the light through the respective condenser lenses 251 to 254 to the incident end surface 271 of the optical fiber 270 and mirrors (second optical elements) to reflect the light reflected on the incident end surface 271 to the condenser lenses 251 to 254 and the semiconductor laser diodes 241 to 244.

Although the present embodiment is configured with the four semiconductor laser diodes 241 to 244 at wavelengths different from each other that are used to acquire the four kinds of hologram data in accordance with the wavelengths, an image of the observation target object may be reconfigured based on the hologram data and semiconductor laser diodes of at least three wavelengths (e.g., 400 nm, 520 nm, and 800 nm) may be used to acquire three kinds of hologram data.

First Modification of Light Source Module 240

Figure 5:
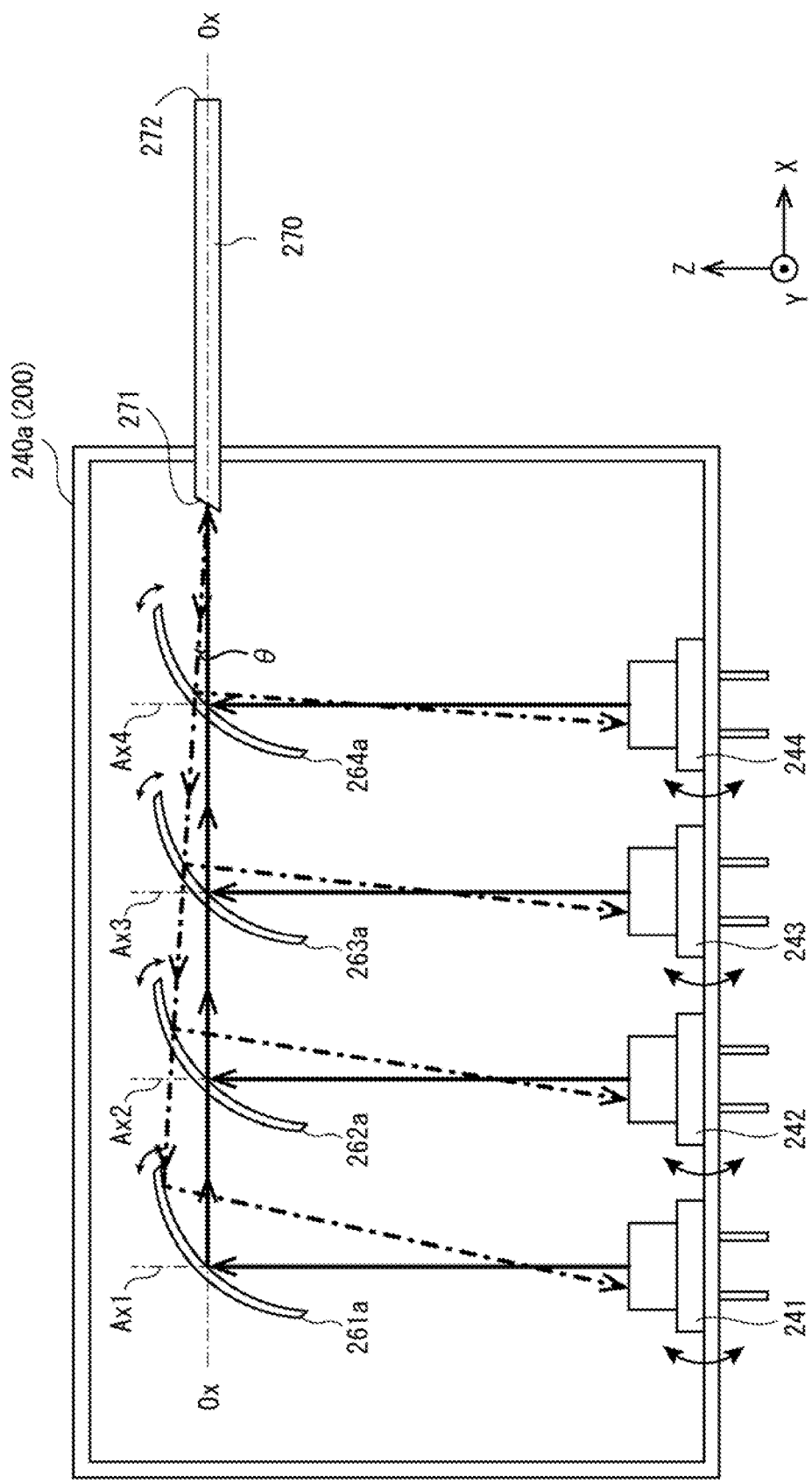
FIG. 5 is a cross-sectional view illustrating a first modification of the light source module of the holographic observation apparatus according to the above embodiment of the present invention.

FIG. 5 is a cross-sectional view illustrating a first modification of the light source a light source module 240a module 240 of the light source section 2 in the present embodiment. As illustrated in FIG. 5, the in the present modification is different from the light source module 240 in the above embodiment in that concave mirrors 261a to 264a are provided instead of the condenser lenses 251 to 254 and the reflective mirrors 261 to 264 of the light source module 240 in the above embodiment. That is, the light source module 240a in the present modification is provided with: four semiconductor laser diodes 241 to 244 to emit light at wavelengths different from each other; the concave mirrors 261a to 264a to reflect light from the respective semiconductor laser diodes 241 to 244; an optical fiber 270 to receive the incident light reflected on the respective concave mirrors 261a to 264a and lead the light to be emitted to the cells on the culture plate 3; and a box case containing the semiconductor laser diodes 241 to 244 and the concave mirrors 261a to 264a and supporting a base end of the optical fiber 270.

The concave mirrors 261a to 264a are optical elements to reflect light from the respective semiconductor laser diodes 241 to 244 to an incident end surface 271 of the optical fiber 270 and to reflect the light reflected on the incident end surface 271 to the semiconductor laser diodes 241 to 244, and in the present modification, are concave (e.g., elliptic or parabolic) bandpass filter mirrors configured to only reflect the light of the corresponding semiconductor laser diodes 241 to 244. As indicated by arrows in solid lines in FIG. 5, the respective concave mirrors 261a to 264a in the present modification reflect the light incident on the plane of incidence along an optical axis Ox of the optical fiber 270 (i.e., in the X axis direction). The respective concave mirrors 261a to 264a are rotatably configured about central axes extending in the Y axis direction through intersections of the optical axis Ox of the optical fiber 270 and optical axes Ax1 to Ax4 of the semiconductor laser diodes 241 to 244 and are capable of adjusting the angles by an angle adjustment mechanism (return light adjustment section), not shown. As described above, the respective concave mirrors 261a to 264a in the present modification are configured to only reflect the light of the corresponding semiconductor laser diodes 241 to 244, and thus the light reflected on the concave mirror 261a (i.e., light at the wavelength of the semiconductor laser diode 241) passes through the concave mirrors 262a, 263a, and 264a to be incident on the incident end surface 271 of the optical fiber 270. Likewise, the light reflected on the concave mirror 262a (i.e., light at the wavelength of the semiconductor laser diode 242) passes through the concave mirrors 263a and 264a to be incident on the incident end surface 271 of the optical fiber 270, the light reflected on the concave mirror 263a (i.e., light at the wavelength of the semiconductor laser diode 243) passes through the concave mirror 264a to be incident on the incident end surface 271 of the optical fiber 270, and the light reflected on the concave mirror 264a (i.e., light at the wavelength of the semiconductor laser diode 244) is directly incident on the incident end surface 271 of the optical fiber 270.

As illustrated in FIG. 5, similar to the above embodiment, the incident end surface 271 of the optical fiber 270 in the present modification is a tapered surface in such a manner that the normal line and the optical axis Ox are inclined to make a predetermined angle θ that is not 0 and is configured to partially reflect the light incident on the incident end surface 271. In other words, a portion of the light incident on the incident end surface 271 is reflected at the predetermined angle θ relative to the optical axis Ox and the light except the reflected light is incident on the incident end surface 271 into the optical fiber 270 to be led for emission from an emitting end surface 272. In the light reflected on the incident end surface 271 (indicated by arrows in dash-dotted lines in FIG. 5), the light at the wavelength of the semiconductor laser diode 244 is reflected on the concave mirror 264a to be incident on the semiconductor laser diode 244 as return light. In the light reflected on the incident end surface 271, the light at the wavelength of the semiconductor laser diode 243 is reflected on the concave mirror 263a to be incident on the semiconductor laser diode 243 as return light. In the light reflected on the incident end surface 271, the light at the wavelength of the semiconductor laser diode 242 is reflected on the concave mirror 262a to be incident on the semiconductor laser diode 242 as return light. In the light reflected on the incident end surface 271, the light at the wavelength of the semiconductor laser diode 241 is reflected on the concave mirror 261a to be incident on the semiconductor laser diode 241 as return light.

As just described, similar to the above embodiment, the present modification is configured to return a portion of the light emitted from the respective semiconductor laser diodes 241 to 244 to the respective semiconductor laser diodes 241 to 244 (i.e., to form return light) and the amount of the return light to the respective semiconductor laser diodes 241 to 244 is adjusted by adjusting the angles to rotate the respective concave mirrors 261a to 264a. Accordingly, the emission spectra of the respective semiconductor laser diodes 241 to 244 become discretely spread. Although the present modification is configured to adjust the angles to rotate the respective concave mirrors 261a to 264a, another modification may be configured to adjust the angles to rotate the semiconductor laser diodes 241 to 244.

Second Modification of Light Source Module 240

Figure 6:
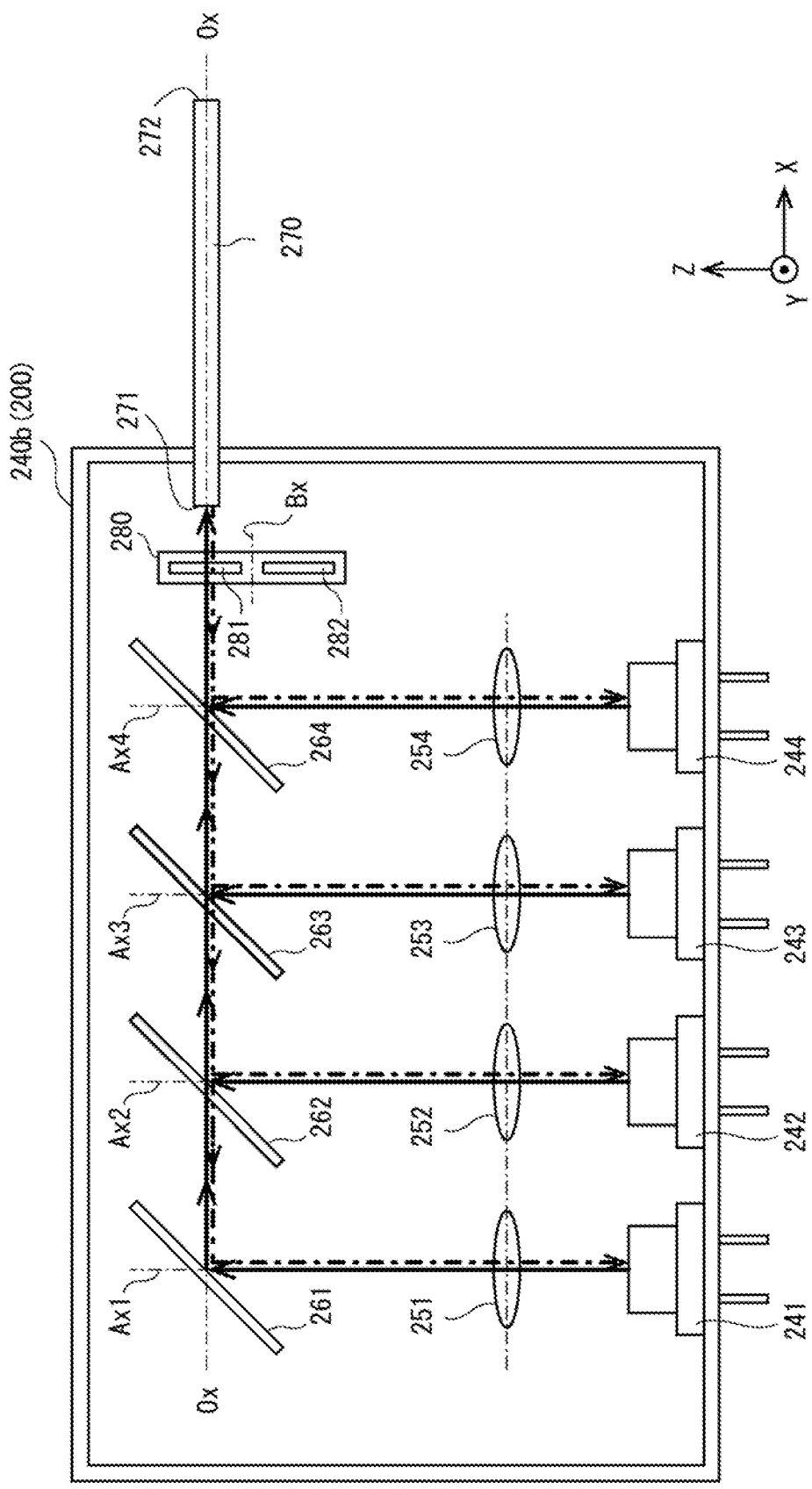
FIG. 6 is a cross-sectional view illustrating a second modification of the light source module of the holographic observation apparatus according to the above embodiment of the present invention.

FIG. 6 is a cross-sectional view illustrating a second modification of the light source module 240 of the light source section 2 in the above embodiment. As illustrated in FIG. 6, a light source module 240b in the present modification is different from the light source module 240 in the above embodiment in that a dichroic mirror module is provided between the reflective mirror 264 of the light source module 240 and the incident end surface 271 of the optical fiber 270 in the above embodiment and the incident end surface 271 of the optical fiber 270 is formed approximately vertical to the optical axis Ox. That is, the light source module 240b in the present modification is provided with: four semiconductor laser diodes 241 to 244 to emit light at wavelengths different from each other; condenser lenses 251 to 254 to concentrate the light emitted from the respective semiconductor laser diodes 241 to 244; reflective mirrors 261 to 264 to reflect the light through the respective condenser lenses 251 to 254; a dichroic mirror module 280 to receive the incident light reflected on the respective reflective mirrors 261 to 264; an optical fiber 270 to receive the incident light through the dichroic mirror module 280 and lead the light for emission to the cells on the culture plate 3; and a box case 200 containing the semiconductor laser diodes 241 to 244, the condenser lenses 251 to 254, the reflective mirrors 261 to 264, and the dichroic mirror module 280 and supporting a base end of the optical fiber 270. It should be noted that the respective reflective mirrors 261 to 264 in the present modification are fixed at a predetermined angle relative to the optical axis Ox and do not rotate as the reflective mirrors 261 to 264 in the above embodiment.

The dichroic mirror module 280 is a disk-shaped component having four dichroic mirrors 281 to 284 (dichroic mirrors 283 and 284 are not shown in FIG. 6) with different transmittances in accordance with the wavelengths of the respective semiconductor laser diodes 241 to 244 disposed at regular angular intervals (e.g., 90°) and is rotatably configured about a rotation axis Bx extending in the X axis direction. Then, in accordance with any of the semiconductor laser diodes 241 to 244 selected by the illumination timing signal generation section 27, the dichroic mirror module 280 is rotated to switch the dichroic mirrors 281 to 284, thereby controlling the amount of the return light to the respective semiconductor laser diodes 241 to 244. That is, when the semiconductor laser diode 241 is selected by the illumination timing signal generation section 27 for light emission of the semiconductor laser diode 241, the dichroic mirror 281 is disposed on the optical axis Ox. Then, the light reflected on the reflective mirror 261 (i.e., light at the wavelength of the semiconductor laser diode 241) passes through the reflective mirrors 262, 236, and 264 and the dichroic mirror 281 to be incident on the incident end surface 271 of the optical fiber 270. Likewise, when the semiconductor laser diode 242 is selected by the illumination timing signal generation section 27 for light emission of the semiconductor laser diode 242, the dichroic mirror 282 is disposed on the optical axis Ox. Then, the light reflected on the reflective mirror 262 (i.e., light at the wavelength of the semiconductor laser diode 242) passes through the reflective mirrors 236 and 264 and the dichroic mirror 282 to be incident on the incident end surface 271 of the optical fiber 270. Likewise, when the semiconductor laser diode 243 is selected by the illumination timing signal generation section 27 for light emission of the semiconductor laser diode 243, the dichroic mirror 283 is disposed on the optical axis Ox. Then, the light reflected on the reflective mirror 263 (i.e., light at the wavelength of the semiconductor laser diode 243) passes through the reflective mirror 264 and the dichroic mirror 283 to be incident on the incident end surface 271 of the optical fiber 270. Likewise, when the semiconductor laser diode 244 is selected by the illumination timing signal generation section 27 for light emission of the semiconductor laser diode 244, the dichroic mirror 284 is disposed on the optical axis Ox. Then, the light reflected on the reflective mirror 264 (i.e., light at the wavelength of the semiconductor laser diode 244) passes through the dichroic mirror 284 to be incident on the incident end surface 271 of the optical fiber 270.

As illustrated in FIG. 6, in the present modification, the incident end surface 271 of the optical fiber 270 is formed approximately vertical to the optical axis Ox and is configured to partially reflect the light incident on the incident end surface 271. In other words, a portion of the light incident on the incident end surface 271 is reflected in a direction vertical to the optical axis Ox (i.e., direction opposite to the axis direction) and the light except the reflected light is incident on the incident end surface 271 into the optical fiber 270 to be led for emission from an emitting end surface 272. In the light reflected on the incident end surface 271 (indicated by arrows in dash-dotted lines in FIG. 5), the light at the wavelength of the semiconductor laser diode 244 passes through the dichroic mirror 284 and reflected on the reflective mirror 264 to be incident on the semiconductor laser diode 244 as return light. In the light reflected on the incident end surface 271, the light at the wavelength of the semiconductor laser diode 243 passes through the dichroic mirror 283 and reflected on the reflective mirror 263 to be incident on the semiconductor laser diode 243 as return light. In the light reflected on the incident end surface 271, the light at the wavelength of the semiconductor laser diode 242 passes through the dichroic mirror 282 and reflected on the reflective mirror 262 to be incident on the semiconductor laser diode 242 as return light. In the light reflected on the incident end surface 271, the light at the wavelength of the semiconductor laser diode 241 passes through the dichroic mirror 281 and reflected on the reflective mirror 261 to be incident on the semiconductor laser diode 241 as return light.

As just described, similar to the above embodiment, the present modification is configured to return a portion of the light emitted from the respective semiconductor laser diodes 241 to 244 to the respective semiconductor laser diodes 241 to 244 (i.e., to form return light) and to allow switching of the amount of the return light to the semiconductor laser diodes 241 to 244 by switchably disposing the four dichroic mirrors 281 to 284 with different transmittances on the optical path of the return light in accordance with the wavelengths of the respective semiconductor laser diodes 241 to 244. That is, by switching the dichroic mirrors 281 to 284, the amounts of the return light to the respective semiconductor laser diodes 241 to 244 are adjusted optimally (i.e., to cause the emission spectra to be discretely spread).

The embodiments disclosed herein should be considered merely as examples in all aspects and not restrictive. The scope of the present invention is shown not by the above description but by the appended claims and it is intended to include all changes within the meaning and scope of the claims.

What is claimed is:

1. An observation apparatus for observing a culture, the apparatus connected to an optical fiber and emit light from the optical fiber, comprising:
    a plurality of laser light sources to respectively emit light at different wavelengths;
    a current source to supply a drive current with a superimposed alternating-current component to each laser light source;
    a light source control section to selectively switch the laser light sources by controlling the current sources;
    a plurality of optical systems disposed in optical paths of the respective laser light sources to reflect the light from the respective laser light sources to an incident end of the optical fiber and to reflect return light reflected on the incident end to the respective laser light sources; and
    a return light adjustment section to adjust an amount of the return light to continuously spread a spectrum of the light emitted from the optical fiber, wherein the return light adjustment section adjusts the amount of the return light by changing an angle of the return light reflected on the incident end to each laser light source relative to an optical axis of the light emitted from the each laser light source.

2. The apparatus according to claim 1, wherein each optical system is disposed along an optical axis of the optical fiber to cause an optical path center of the light directed from each optical system to the incident end of the optical fiber to approximately coincide with the optical axis of the optical fiber.

3. The apparatus according to claim 1, further comprising a plurality of condenser lenses disposed between the respective laser light sources and the respective optical systems to concentrate the light from the respective laser light sources, wherein
the return light adjustment section adjusts the amount of the return light by changing an angle of each condenser lens relative to an optical axis of the respective laser light source.

4. The apparatus according to claim 1, wherein each optical system is a reflection bandpass filter having a flat reflection surface to reflect the light from the laser light source corresponding to the optical system and to transmit the light from the other laser light sources.

5. The apparatus according to claim 1, wherein each optical system is a reflection bandpass filter having an elliptic or parabolic reflection surface to reflect the light from the laser light source corresponding to the optical system and to transmit the light from the other laser light sources.

6. The apparatus according to claim 1, wherein a frequency of the alternating current component is from 50 kHz to 300 kHz.

7. The apparatus according to claim 1 wherein the incident end of the optical fiber is a tapered surface inclined from 3° to 7° relative to an optical axis of the optical fiber.

8. The apparatus according to claim 1, wherein each optical system has a first optical element and a second optical element disposed in the optical path of the respective laser light source, the first optical element to reflect the light from the respective laser light source to the incident end of the optical fiber and the second optical element to direct the return light reflected on the incident end of the optical fiber to the respective laser light source.

9. A holographic observation apparatus comprising:
the apparatus according to claim 1;
an illumination optical system to cause the light emitted from the optical fiber to transmit or to be reflected on an observation target object for interference of the transmitted or reflected light in a different position of the observation target object; and
an image sensor to acquire an interference figure produced by the light that has transmitted or is reflected on the observation target object.

10. An observation apparatus for observing a culture, the apparatus connected to an optical fiber and emit light from the optical fiber, comprising:
a plurality of laser light sources to respectively emit light at different wavelengths;
a current source to supply a drive current with a superimposed alternating-current component to each laser light source;
a light source control section to selectively switch the laser light sources by controlling the current sources;
a plurality of optical systems disposed in optical paths of the respective laser light sources to reflect the light from the respective laser light sources to an incident end of the optical fiber and to reflect return light reflected on the incident end to the respective laser light sources; and
a return light adjustment section to adjust an amount of the return light to continuously spread a spectrum of the light emitted from the optical fiber;
wherein the return light adjustment section has a plurality of dichroic mirrors corresponding to the wavelength of each laser light source and having a transmittance set based on the amount of the return light, and based on the laser light source selected by the light source control section, the dichroic mirror corresponding to the laser light source is disposed between the optical systems and the incident end of the optical fiber.

* * * * *